US010045435B2

(12) United States Patent
Jones et al.

(10) Patent No.: US 10,045,435 B2
(45) Date of Patent: Aug. 7, 2018

(54) CONCENTRIC VIAS AND PRINTED CIRCUIT BOARD CONTAINING SAME

(71) Applicant: L-3 Communications Corporation, New York, NY (US)

(72) Inventors: Dennis Jones, Allen, TX (US); Christopher Anthony Gracia, Richardson, TX (US); Larry Brown, Prosper, TX (US); David Nail, Flower Mound, TX (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 14/949,143

(22) Filed: Nov. 23, 2015

(65) Prior Publication Data

US 2017/0150594 A1 May 25, 2017

(51) Int. Cl.
*H05K 1/02* (2006.01)
*H05K 3/42* (2006.01)

(52) U.S. Cl.
CPC ......... *H05K 1/0251* (2013.01); *H05K 1/0222* (2013.01); *H05K 3/429* (2013.01)

(58) Field of Classification Search
CPC ..... H05K 1/0251; H05K 1/0222; H05K 3/429
See application file for complete search history.

(56) References Cited

U.S. PATENT DOCUMENTS

| 5,949,030 A * | 9/1999 | Fasano | H01L 21/486 174/262 |
|---|---|---|---|
| 7,091,424 B2 * | 8/2006 | Oggioni | H01L 23/66 174/262 |
| 7,679,006 B2 * | 3/2010 | Nakamura | H05K 1/0251 174/262 |
| 8,354,601 B2 * | 1/2013 | Russell | H05K 1/0222 174/262 |
| 8,502,085 B2 * | 8/2013 | Kim | H05K 1/0219 174/262 |

* cited by examiner

*Primary Examiner* — Jeremy C Norris
(74) *Attorney, Agent, or Firm* — Egan Peterman Enders Huston

(57) ABSTRACT

A multilayer printed circuit board comprising: i) a plurality of circuit board layers disposed in parallel planes to one another; ii) an outer via forming an electrical connection between a conductor contact on a first circuit board layer and a conductor contact on a second circuit board layer, wherein the outer via has a hollow central core; and iii) an inner via formed within the hollow central core of the outer via. The inner via forms an electrical connection between a conductor contact on a third circuit board layer and a conductor contact on a fourth circuit board layer. The inner via and the outer via are substantially concentric cylinders.

17 Claims, 5 Drawing Sheets

CONCENTRIC VIAS AND PRINTED CIRCUIT BOARD CONTAINING SAME

TECHNICAL FIELD

The present application relates generally to printed circuit boards and, more specifically, to a via-within-via structure for connecting different layers of a printed circuit board.

BACKGROUND

Many computer systems and communication applications operate at multi-gigabit speeds. Such high speeds pose unique challenges to hardware designers, particularly with respect to multi-layer printed circuit boards. A printed circuit board (PCB) provides a compact means for routing signals between circuit components mounted on the PCB. However, printed circuit boards that support multi-gigabit/second digital signals require significant signal integrity. Signal integrity is a major issue not only in high-speed digital electronics, but also in high frequency RF systems. While a printed circuit board is efficient at creating a two-dimensional (planar) structure, a PCB is less efficient for three-dimensional structures.

A via is typically used to provide a connection between signal traces on different layers of the printed circuit board. For example, a via is needed to route signal traces between components mounted on opposite sides of the PCB. But, as signal frequencies increase, the wavelength of the signal decreases. Physical dimensions greater than, for example, $\frac{1}{10}^{th}$ of a wavelength may degrade the signal as the signal propagates through a printed circuit board. Signal degradation results in unwanted signal loss, ripple, and distortion. Moreover, multiple traces on a densely routed PCB are often adjacent to each other, which causes unwanted signal coupling. Good shielding of the traces is required to prevent coupling.

Therefore, there is a need for printed circuit boards that reduce signal degradation and improve signal integrity at high frequencies. In particular, there is a need for improved via structures for use in multi-layer printed circuit boards.

SUMMARY

To address the above-discussed deficiencies of the prior art, it is a primary object to provide a multilayer printed circuit board comprising: i) a plurality of circuit board layers disposed in parallel planes to one another; ii) an outer via forming an electrical connection between a conductor contact on a first circuit board layer and a conductor contact on a second circuit board layer, wherein the outer via has a hollow central core; and iii) an inner via formed within the hollow central core of the outer via, wherein the inner via forms an electrical connection between a conductor contact on a third circuit board layer and a conductor contact on a fourth circuit board layer.

In one embodiment, the outer via has a circular cross-section.

In another embodiment, the inner via has a circular cross-section.

In still another embodiment, the outer via has a substantially cylindrical shape.

In yet another embodiment, the inner via has a substantially cylindrical shape.

In a further embodiment, the inner via and the outer via are substantially concentric cylinders.

In a still further embodiment, the inner via is connected to a signal trace on the third circuit board layer and the signal trace is associated with an impedance matching network.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged printed circuit board (PCB).

The present disclosure describes a via-in-via structure that provides a well-shielded, low-loss transition of high frequency signals through multiple layers of a printed circuit board. A via-in-via structure is created by drilling an inner via having a smaller diameter inside an outer via having a larger diameter. For example, a coaxial transmission line may be created by drilling a larger diameter via in a PCB as the outer wall of the coaxial transmission line. A smaller diameter via drilled inside the larger via creates the inner conductor of the coaxial transmission line. Other structures are possible with this technique include twin-axial transmission lines.

The larger diameter via is formed by drilling a hole in the printed circuit board and conductively plated to a known thickness, which defines the outer diameter of the coaxial transmission line. The larger via is then filled with a non-conductive filler, such as an epoxy with a known dielectric constant. The inner via diameter is selected to provide the desired signal impedance, which is a function of the outer diameter, the inner diameter, and the dielectric constant of the filler.

To further reduce the physical size of the coaxial via-in-via structure, a low-valued characteristic impedance may be selected for the dimensions. Signal traces of a fixed impedance transition into and out of the via-in-via structure by way of a via in capture pad 150. The capture pad 150 may capacitively couple to an adjacent ground plane layer. The PCB stack-up implementation determines the length of the via and the size of capture pad 150. These features transitioning from the signal layer into the coaxial transmission line mode may create a substantial reflection. In addition, the signal trace impedance may differ from that of the via-in-via structure, also contributing to reflection of the signal. Matching networks may be used to phase-match the reflections caused by the transition between the via-and-via structure and the signal trace. For example, an open stub may be placed on the signal trace on the layer where the signal trace transitions into the center via of the coaxial via-in-via structure. Additionally, a hole inserted into the adjacent ground plane layer immediately above the capture pad may improve the match as well.

Figure 1:
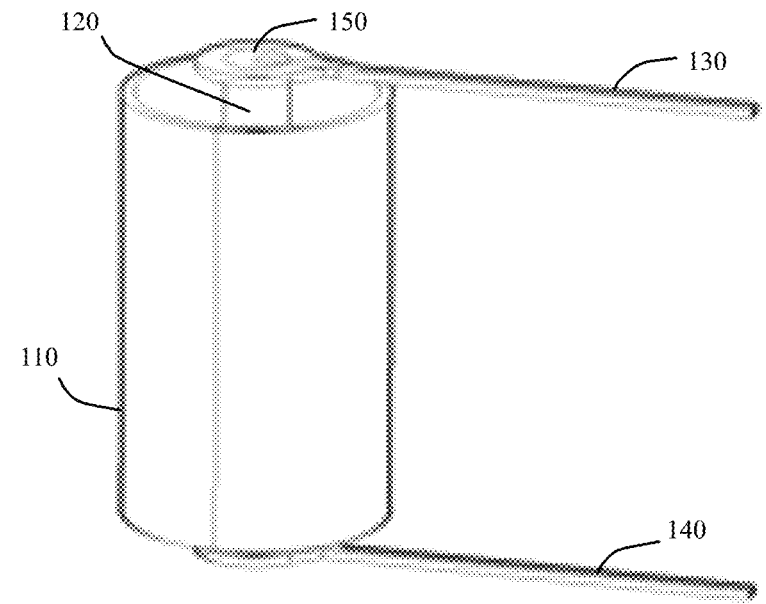
FIG. 1 illustrates a perspective view of a via-in-via structure for use in a printed circuit board (PCB) according to the principles of the present disclosure.
Figure 1:

FIG. 1 illustrates a perspective view of via-in-via structure 100 for use in a printed circuit board (PCB) according to the principles of the present disclosure. In FIG. 1, the layers of a multi-layer PCB are not shown for clarity of explanation. Via-in-via structure 100 comprises outer via 110 and inner via 120, which is disposed inside of outer via 110. One end of inner via 120 is connected to signal trace 130 by capture pad 150. The other end of inner via 120 is connected to signal trace 140 by another capture pad (not shown). Alternatively, either end or both ends of inner via 120 may be connected to a metallization layer, such as a ground plane or power supply plane.

In an advantageous embodiment, inner via 120 and outer via 110 may be aligned in a manner similar to concentric cylinders. However, in alternate embodiments, inner via 120 may be positioned off-center within outer via 110. Moreover, in alternate embodiments, inner via 120 and/or outer via 110 may not have a circular cross-sectional area. If different cutting or etching tools are used, inner via 120 or outer via 110 may have a cross-sectional area that is a square, a rectangle, or another shape.

Figure 2:
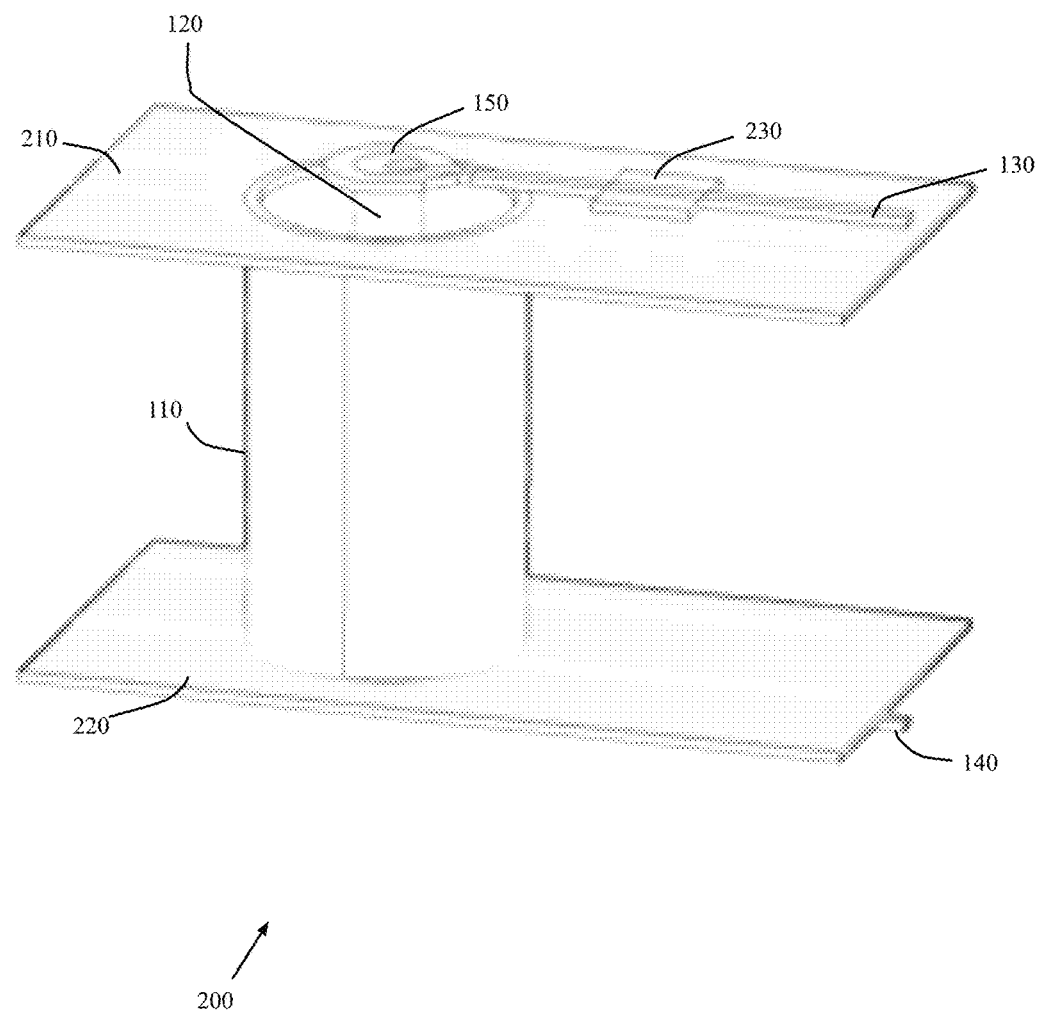
FIG. 2 illustrates a perspective view of a via-in-via structure and two exemplary layers of a printed circuit board (PCB) according to an embodiment of the disclosure.

FIG. 2 illustrates a perspective view of via-in-via structure 100 and exemplary layers 210 and 220 of printed circuit board (PCB) 200 according to an embodiment of the disclosure. In FIG. 2, upper layer 210 and lower layer 220 represent the circuit conductor contacts (e.g., metallization layers, signal traces) that are intended to make contact with outer via 110. The substrate portion (e.g., epoxy) of each layer is omitted for clarity.

Upper layer 210 is aligned with the top end of outer via 110 and lower layer 220 is aligned with the bottom end of outer via 110. It is intended for both layers 210 and 220 to be metalized up to and including the outer circumference of via 110. Layer 210 provides a ground reference for signal trace 130 and layer 220 provides a ground reference for signal trace 140. The ohmic contact between layer 210 and via 110 and the ohmic contact between layer 220 and via 110 provide a low-impedance ground path for both signal traces on signal traces 130 and 140. If the impedance of signal trace 130 is different than the impedance of coaxial via-in-via structure 100, then matching network 230 may be added to signal trace 130 to match impedances. Signal trace 130 is separated from upper layer 210 by the substrate portion (not shown) of the layer on which signal trace 130 is disposed.

Figure 3:
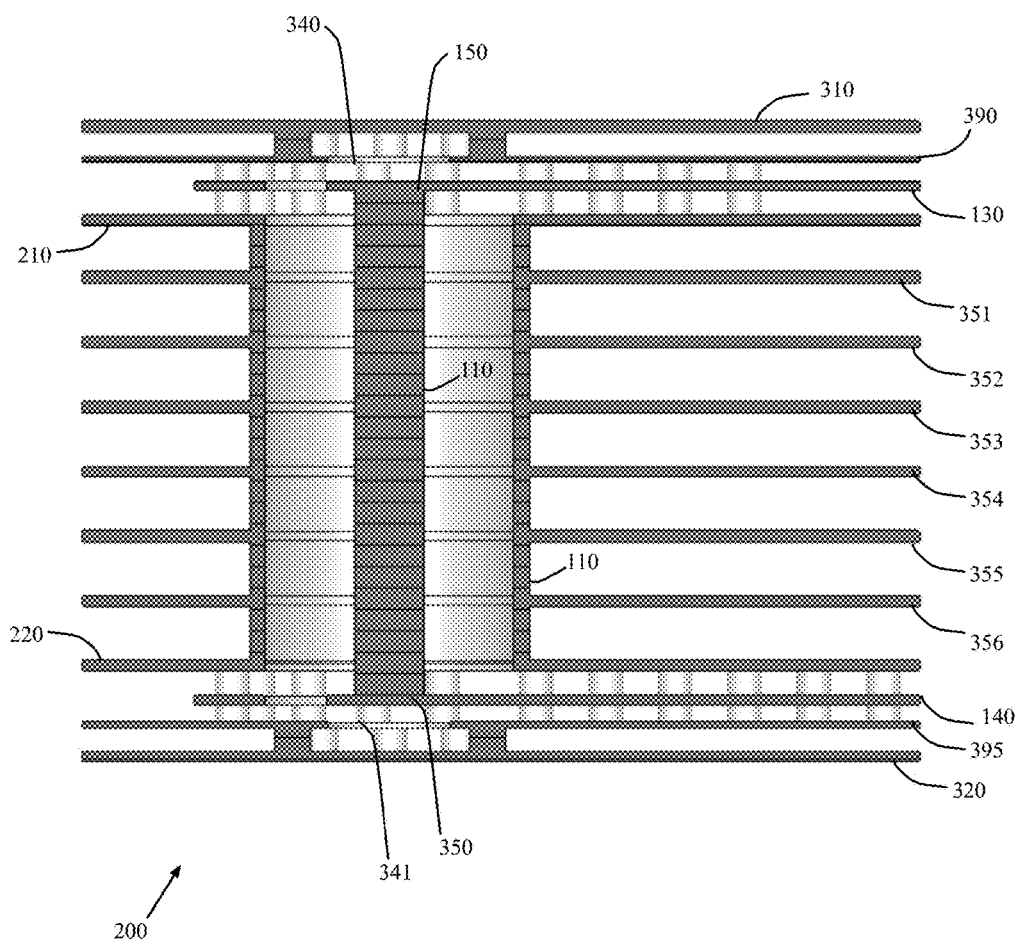
FIG. 3 illustrates a cross-sectional view of a via-in-via structure in a multi-layer printed circuit board (PCB) according to an embodiment of the disclosure.

FIG. 3 illustrates a cross-sectional view of via-in-via structure 100 and multi-layer printed circuit board (PCB) 200 according to an embodiment of the disclosure. In FIG. 3, additional layers 351-356 are shown between upper layer 210 and lower layer 220. As in FIG. 2, layers 351-356 represent the circuit conductor contacts (e.g., metallization layers, signal traces) that are intended to make contact with outer via 110. The substrate portion (e.g., epoxy) of each layer is omitted for clarity.

Also shown in FIG. 3 are top layer 310, bottom layer 320, and ground planes 390 and 395. To reduce coupling, hole 340 is cut in ground plane 390 above capture pad 150. At the opposite end of inner via 110, hole 341 is similarly cut in ground plane 395 below capture pad 350 for trace 140.

Figure 4:
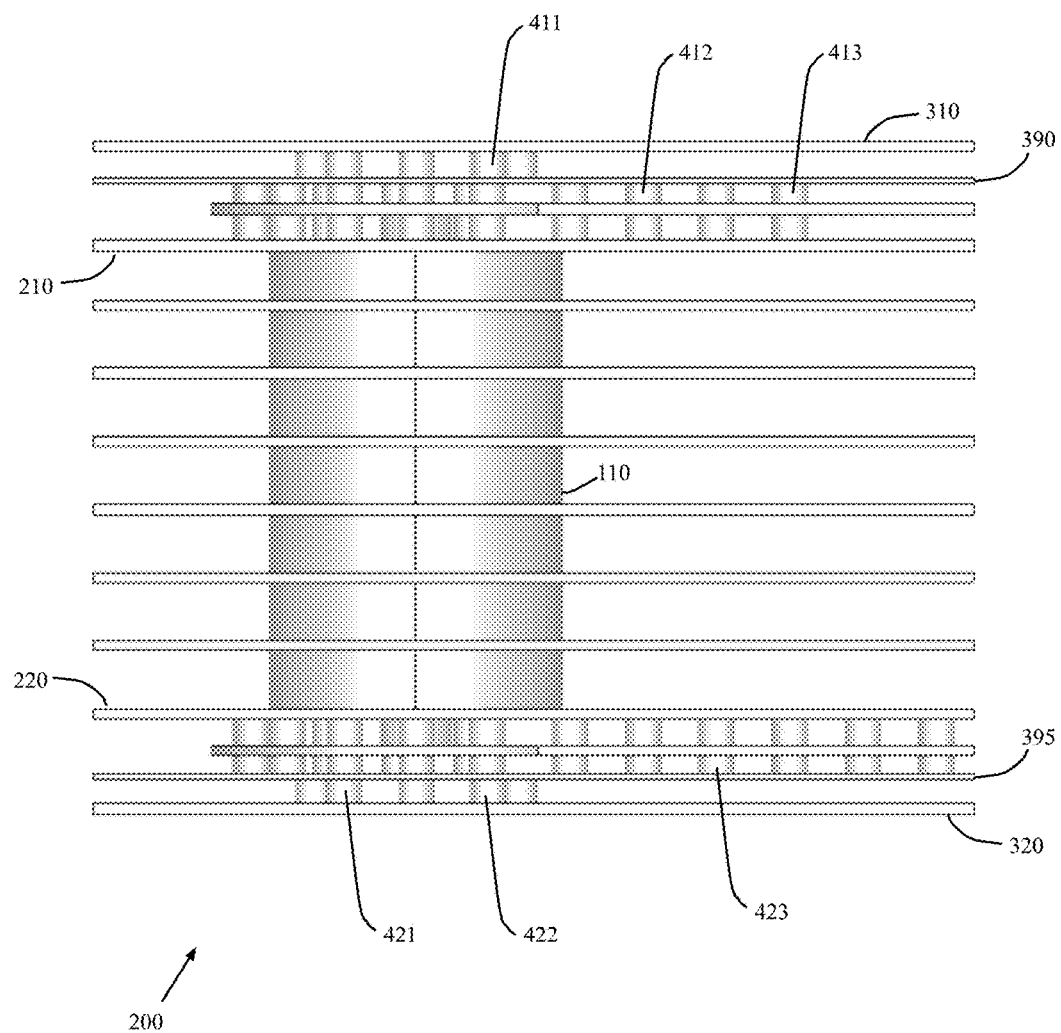
FIG. 4 illustrates a side view of a via-in-via structure in a multi-layer printed circuit board (PCB) according to an embodiment of the disclosure.

FIG. 4 illustrates a side view of via-in-via structure 100 in multi-layer printed circuit board (PCB) 200 according to an embodiment of the disclosure. In FIG. 4, a plurality of smaller vias connects different layers. For example, via 411 connects top layer 310 and upper layer 210, and vias 412 and 413 connect ground plane 390 and upper layer 210. Similarly, vias 421 and 422 connect bottom layer 310 and lower layer 220, and via 423 connects ground plane 395 and bottom layer 220. The plurality of vias establishes continuity between ground layers and signal containment within individual signal layers.

Figure 5:
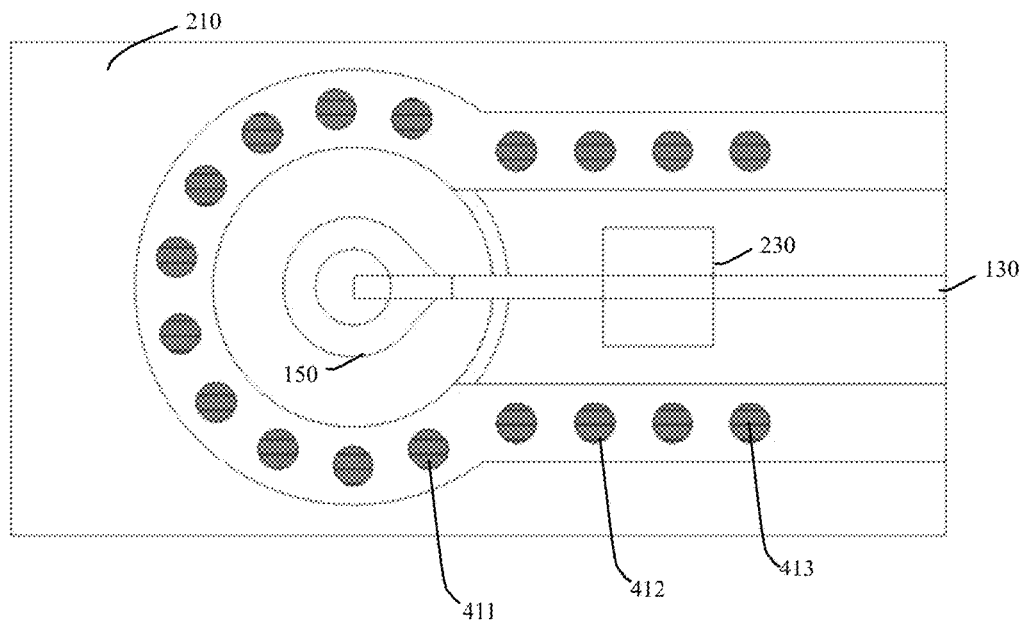
FIG. 5 illustrates a top view of a via-in-via structure in a multi-layer printed circuit board (PCB) according to an embodiment of the disclosure.

FIG. 5 illustrates a top view of via-in-via structure 100 in multi-layer printed circuit board (PCB) 100 according to an embodiment of the disclosure. In FIG. 5, signal trace 130 is coupled to capture pad 150 through matching network 230. The tops of a plurality of vias are visible on upper layer 210, including vias 411, 412 and 412. Capture pad 150 is connected to one end of inner via 120 (not visible).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A multilayer printed circuit board comprising:
   a plurality of circuit board layers disposed in planes parallel to one another;
   an outer via forming an electrical connection between a conductor contact on a first circuit board layer and a conductor contact on a second circuit board layer, wherein the outer via has a hollow central core;
   an inner via formed within the hollow central core of the outer via, wherein the inner via forms an electrical connection between a conductor contact on a third circuit board layer and a conductor contact on a fourth circuit board layer;
   a first ground plane disposed on a first external side of the plurality of circuit board layers and providing shielding for a signal trace proximate the first circuit board layer; and
   a second ground plane disposed on a second external side of the plurality of circuit board layers opposite the first external side and providing shielding for a signal trace proximate the second circuit board layer;

wherein the inner via is connected to a signal trace on the third circuit board layer and the signal trace is associated with an impedance matching network.

2. The multilayer printed circuit board as set forth in claim 1, where
the first ground plane is electrically coupled to the outer via by the conductor contact on the first circuit board layer, and the signal trace proximate the first circuit board layer is electrically coupled to the inner via by the conductor contact on the third circuit board layer; and the multilayer printed circuit board further comprising:
a second ground plane disposed on a second external side of the plurality of circuit board layers opposite the first external side and providing shielding for a signal trace proximate the second circuit board layer, the second ground plane being electrically coupled to the outer via by the conductor contact on the second circuit board layer, and the signal trace proximate the second circuit board layer being electrically coupled to the inner via by the conductor contact on the fourth circuit board layer.

3. The multilayer printed circuit board as set forth in claim 1, wherein the outer via has a circular cross-section.

4. The multilayer printed circuit board as set forth in claim 3, wherein the inner via has a circular cross-section.

5. The multilayer printed circuit board as set forth in claim 3, wherein the outer via has a substantially cylindrical shape.

6. The multilayer printed circuit board as set forth in claim 5, wherein the inner via has a substantially cylindrical shape.

7. The multilayer printed circuit board as set forth in claim 6, wherein the inner via and the outer via are substantially concentric cylinders.

8. The multilayer printed circuit board as set forth in claim 1, where the first ground plane and the conductor contact on the first circuit board layer are disposed at different layers of the multilayer printed circuit board, the first ground plane being electrically connected by one or more conductive vias to the conductor contact on the first circuit board layer; and where the second ground plane and the conductor contact on the second circuit board layer are disposed at different layers of the multilayer printed circuit board, the second ground plane being electrically connected by one or more conductive vias to the conductor contact on the second circuit board layer.

9. The multilayer printed circuit board as set forth in claim 1, where the conductor contact on the third circuit board layer comprises a first pad; where the conductor contact on the fourth circuit board layer comprises a second pad; where a first hole is defined in the first ground plane adjacent and above the first pad; and where a second hole is defined in the second ground plane adjacent and below the second pad.

10. A method of forming a coaxial transmission line in a multilayer printed circuit board comprising:
drilling a first hole through a plurality of layers of the multilayer printed circuit board, the plurality of circuit board layers being disposed in planes parallel to one another;
conductively plating the drilled first hole to a known thickness to thereby form an outer via that defines the outer diameter of the coaxial transmission line;
filling the outer via with a non-conductive filler;
drilling a second hole in the non-conductive filler to form a hollow central core in the outer via;
filling the drilled second hole with a conductor to thereby form an inner via within the hollow central core of the outer via;
forming a first ground plane on a first external side of the multilayer printed circuit board, the first ground plane being electrically coupled to the outer via and providing shielding for a first signal trace disposed on a first one of the plurality of layers that is electrically coupled to the inner via;
forming a conductor contact on a first circuit board layer of the multilayer printed circuit board, and forming a conductor contact on a second circuit board layer of the multilayer printed circuit board, the outer via forming an electrical connection between the conductor contact on the first circuit board layer and the conductor contact on the second circuit board layer;
forming a second ground plane on a second external side of the multilayer printed circuit board opposite the first external side, the second ground plane being electrically coupled to the outer via and providing shielding for a second signal trace disposed on a second one of the plurality of layers that is electrically coupled to the inner via;
forming a conductor contact on a third circuit board layer of the multilayer printed circuit board, and forming a conductor contact on a fourth circuit board layer of the multilayer printed circuit board, the inner via forming an electrical connection between the conductor contact on the third circuit board layer and the conductor contact on the fourth circuit board layer;
where the inner via is connected to a signal trace on the third circuit board layer and the signal trace is associated with an impedance matching network.

11. The method as set forth in claim 10, wherein the outer via has a substantially cylindrical shape.

12. The method as set forth in claim 11, wherein the inner via has a substantially cylindrical shape.

13. The method as set forth in claim 12, wherein the inner via and the outer via are substantially concentric cylinders.

14. The method as set forth in claim 12, wherein a diameter of the inner via is selected to provide a desired signal impedance, wherein the signal impedance is a function of a diameter of the outer via, the diameter of the inner via, and a dielectric constant of the non-conductive filler.

15. The method as set forth in claim 14, wherein the non-conductive filler comprises an epoxy having a known dielectric constant.

16. The method as set forth in claim 10, further comprising:
forming the first conductor contact on a first circuit board layer of the multilayer printed circuit board that is disposed at a different layer than the first ground plane, and forming the second conductor contact on a second circuit board layer of the multilayer printed circuit board that is disposed at a different layer than the first ground plane, the outer via forming an electrical connection between the first conductor contact and the second conductor contact;
forming one or more electrically conductive vias to electrically connect the first ground plane to the first conductor contact; and
forming one or more electrically conductive vias to electrically connect the second ground plane to the second conductor contact.

17. The method as set forth in claim 10, further comprising:
forming a first pad on the third circuit board layer of the multilayer printed circuit board to electrically couple the first signal trace to the inner via;

forming a second pad on the fourth circuit board layer of the multilayer printed circuit board to electrically couple the second signal trace to the inner via;

forming a first hole in the first ground plane adjacent and above the first pad; and forming a second hole in the second ground plane adjacent and below the second pad.

\* \* \* \* \*